United States Patent [19]

Magee

[11] Patent Number: 5,669,136
[45] Date of Patent: Sep. 23, 1997

[54] METHOD OF MAKING HIGH INPUT/ OUTPUT DENSITY MLC FLAT PACK

[75] Inventor: Robert Arthur Magee, Poughkeepsie, N.Y.

[73] Assignee: International Business Machines Corporation, Armonk, N.Y.

[21] Appl. No.: 541,397

[22] Filed: Oct. 10, 1995

Related U.S. Application Data

[63] Continuation of Ser. No. 265,299, Jun. 24, 1994, abandoned.

[51] Int. Cl.⁶ ........................................... H05K 3/36
[52] U.S. Cl. ..................... 29/830; 79/852; 156/89; 257/724; 264/61; 361/772
[58] Field of Search ........................... 29/830, 840, 852; 156/89; 264/61; 257/724; 361/772

[56] References Cited

U.S. PATENT DOCUMENTS

| | | | |
|---|---|---|---|
| H498 | 7/1988 | Keller et al. | 361/772 |
| 3,852,877 | 12/1974 | Ahn et al. | 29/830 X |
| 3,968,193 | 7/1976 | Longston, Jr. et al. | 257/724 X |
| 4,079,927 | 3/1978 | Rocton | 269/296 |
| 4,221,047 | 9/1980 | Narken et al. | 257/724 X |
| 4,237,606 | 12/1980 | Niwa et al. | |
| 4,417,392 | 11/1983 | Ibrahim et al. | 29/840 |
| 4,437,141 | 3/1984 | Prokop | 361/785 |
| 4,443,278 | 4/1984 | Zingher | 29/830 X |
| 4,641,425 | 2/1987 | Dubuisson et al. | 29/830 |
| 4,736,275 | 4/1988 | Kendall et al. | 361/772 |
| 4,821,945 | 4/1989 | Chase et al. | 228/180.1 |
| 4,852,788 | 8/1989 | Patrikios | 228/110 |
| 4,949,223 | 8/1990 | Achiva | 361/776 |
| 5,048,178 | 9/1991 | Bindra et al. | 29/830 |
| 5,151,771 | 9/1992 | Hiroi et al. | 257/676 |
| 5,191,404 | 3/1993 | Wu et al. | 257/724 |
| 5,454,161 | 10/1995 | Beilin et al. | 29/852 |

FOREIGN PATENT DOCUMENTS

| | | | |
|---|---|---|---|
| 60-35524 | 2/1985 | Japan | 257/786 |
| 137884 | 7/1985 | Japan | 29/832 |
| 62-43160 | 2/1987 | Japan | 257/786 |
| 1-207955 | 8/1989 | Japan | 257/673 |
| 2-65265 | 3/1990 | Japan | 257/724 |
| 2-251146 | 10/1990 | Japan | 257/786 |
| 4-56358 | 2/1992 | Japan | 257/786 |
| 5-109977 | 4/1993 | Japan | 257/786 |
| 2237691 | 5/1991 | United Kingdom | 257/724 |

OTHER PUBLICATIONS

IBM Disclosure Bulletin "Semiconductor Device Carrier For Modules" by McMahon, Jr. vol. 18 No. 5 Oct. 1975 pp. 1440 and 1441.

IBM Technical Disclosure Bulletin "Surface Solder Package" vol. 30 No. 3 Aug. 1987 (pp. 1240 and 1241).

IBM Technical Disclosure Bulletin, Terminal Clip For Printed Circuit Card by D.O. Johnson, Jr.; vol. 9, No. 10, Mar. 1967, p. 1306.

*Primary Examiner*—Carl J. Arbes
*Attorney, Agent, or Firm*—John J. Tomaszewski; DeLio & Peterson, LLC; Azia M. Ahsan

[57] ABSTRACT

A high density I/O flat pack electronic component is provided comprising a multilayer ceramic substrate having internal electrical conductors for electrically connecting I/O pads on the periphery of the component to a chip on the electronic component.

10 Claims, 4 Drawing Sheets

METHOD OF MAKING HIGH INPUT/ OUTPUT DENSITY MLC FLAT PACK

This is a continuation of application Ser. No. 08/265,299 filed on Jun. 24, 1994, now abandoned.

BACKGROUND OF THE INVENTION

1. Field of the Invention

This invention relates to semi-conductor electronic components and, more particularly, to increasing the number of input/output connectors on the components by employing multilayer ceramics (MLC) as the component substrate.

2. Description of Related Art

Electronic components are widely used in industry and many different types are utilized. One important type is termed a flat pack and the following will be directed to this type product for convenience. Industry standard flat pack components are normally 40 mm or 28 mm square and are typically constructed with a ceramic or equivalent base and a thin film structure. A chip is secured thereto and electrically connected to input/output (I/O) pads using a fan-out pattern. The product is commonly termed a monolithic package. Typical I/O pad spacing, as measured by the distance between the center lines of I/O pads, is 0.5 mm which results in generally about 304 available I/O points or pads on the 40 mm packs. Connector leads from the outside world to the flat pack are usually beam leads, c-clips, and the like and are fastened to the pad only and may or may not employ a spring clip to the bottom surface for the purpose of mechanical positioning during solder reflow processes. No electrical connection to the bottom surface is possible because the structure is monolithic.

With advancing technology it is very desirable to increase the number of pads on the flat pack so that devices requiring a large number of I/O points can be used. One technique to increase the number of I/O pads is to decrease the width between the leads to say 0.4 mm to provide about 376 pads. It has been found, however, that the mechanical dimensions and physical limitations required to accommodate increased I/O pads in a monolithic pack has become cost prohibitive. Dimensions of pads, pad to pad cumulative tolerances as well as pad to edge and substrate squareness have become critical and not conducive to low cost manufacture. Electronic performance for flat pack or other fan-out pattern design electronic components are therefore frozen and limited by the capabilities of the monolithic fan-out pattern technology. Recognizing the need to accommodate higher performing devices, an MLC flat pack is available which employs a ground or reference plane but still uses the monolithic fan-out pattern technology and does not solve the limiting I/O capability problem nor address the cost of manufacture.

It is one purpose of the present invention to provide electronic components having increased I/O capabilities.

Another purpose of the invention is to provide flat pack electronic components having increased I/O capabilities.

Still another purpose of the invention is to provide a method for making electronic components having increased I/O capabilities.

Other objects and advantages of the invention will be readily apparent from the following description.

SUMMARY OF THE INVENTION

An electronic component is provided which comprises a multilayer ceramic (MLC) substrate having a chip attached thereto, a plurality of contact points or pads on at least one surface of the substrate at the periphery of said substrate said pads being electrically connected to said chip by electrical conductors in the substrate.

In one aspect of the invention an electronic component contains I/O pads on both the top and bottom surfaces of the MLC substrate thereby significantly reducing the pad density for a given I/O design. In another aspect of the invention where pad density is of less concern, the number of I/O pads may be increased substantially by employing pads on both the top and bottom surfaces of the MLC substrate. Additionally, I/O pad configurations of multiple rows on the top surface or the bottom surface as well as multiple rows of I/O pads on both surfaces may be employed. Multiple row designs preferably have adjacent pads staggered.

BRIEF DESCRIPTION OF THE DRAWINGS

For a fuller understanding of the invention, reference should be made to the following description taken in conjunction with the accompanying drawings, in which:

FIGS. 4A and 4B are schematic diagrams of connectors which may be used with the electronic components of the invention.

DESCRIPTION OF THE PREFERRED EMBODIMENTS

Multilayer ceramic (MLC) electronic components such as capacitors are well-known in the art. In general, ceramic layers and metal layers are stacked to form a laminated (interdigitated) block in which the metal and ceramic layers alternate.

It has now been found that MLC's can be utilized to form electronic components requiring electrical connections from components positioned on the MLC substrate (such as a chip) to I/O connectors such as pads positioned on the periphery of the MLC substrate. The MLC's are fabricated to provide electrical conductors such as copper, molybdenum and tungsten which are commonly referred to as wires, leads, traces, lines, vias, etc. within the laminated MLC block with an electrical connection from a site on the chip to a corresponding pad at the periphery of the block being effected by an electrical conductor. The thickness of the electrical conductor may vary widely from about 0.01 mm to about 0.05 mm or more. The MLC substrate may have any number of layers with a four layer structure being exemplary for purposes of describing the invention.

While the electrical conductors pass from the pads, through the substrate and are then electrically connected to the chip, it is also a feature of this invention that conductors on the surface or surfaces of the substrate such as described for the fan-out technology, may also be employed together with the internal conductor design of the present invention for special applications.

Figure 1A:
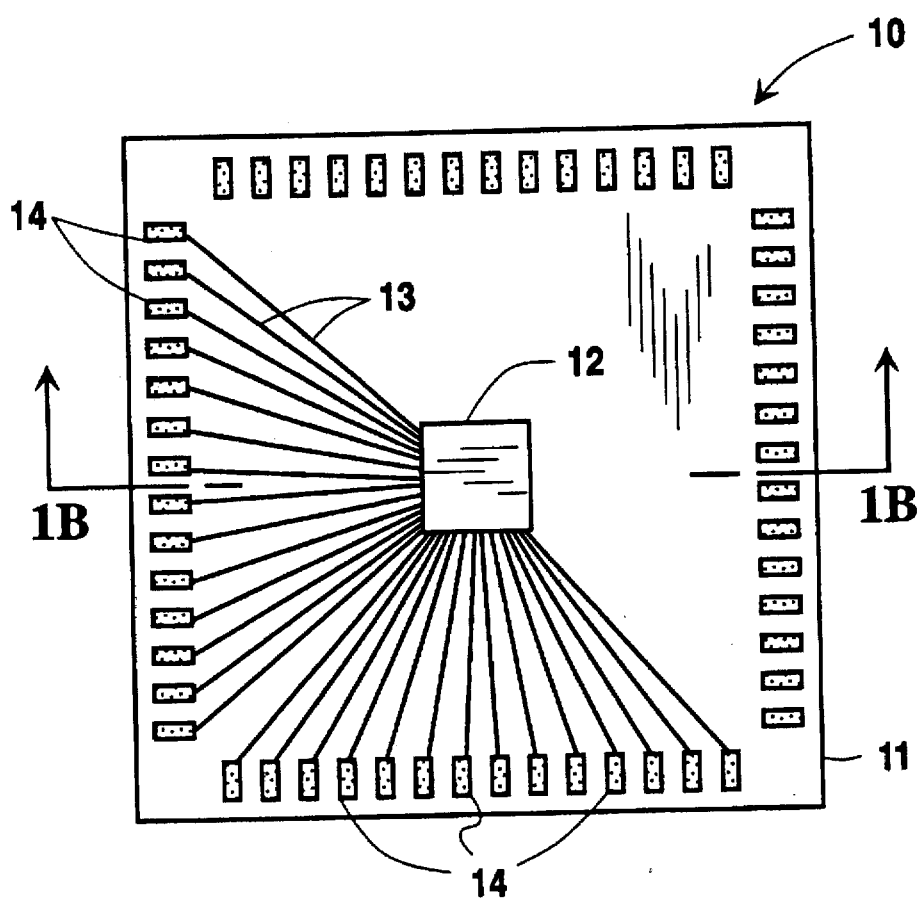
FIG. 1A is a fragmented schematic diagram of a prior art flat pack electronic component having a fan-out pattern design.
Figure 1B:
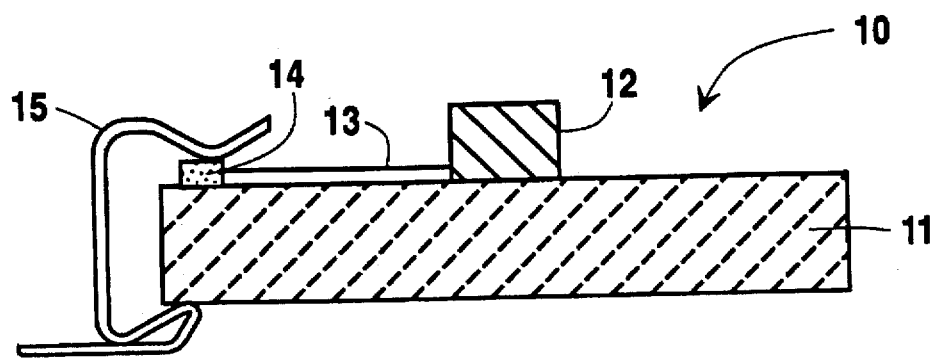
FIG. 1B is a side view of FIG. 1A taken along lines 1B—1B.

FIG. 1A shows a typical flat pack electronic component 10. The component has a substrate 11 having mounted thereon chip 12. Electrical conductors 13 electrically connect the chip to corresponding I/O pads 14 positioned at the periphery of the component 10 as is well known in the art. FIG. 1B is a side view of component 10. The substrate 11 is usually ceramic having a thickness of about 1.5 mm. Chip 12 is generally a semiconductor chip comprising a silicon integrated circuit. Electrical conductor 13 electrically connects the chip 12 to I/O pad 14 and C-clip 15 electrically connects the component 10 to a peripheral unit.

The contact pads 14 shown at the periphery of substrate 11 measure approximately 0.25 mm to 0.30 mm by 0.9 mm to 1.1 mm and are about 2 μm thick and typically comprise multilayers of chromium-copper.

Figure 2A:
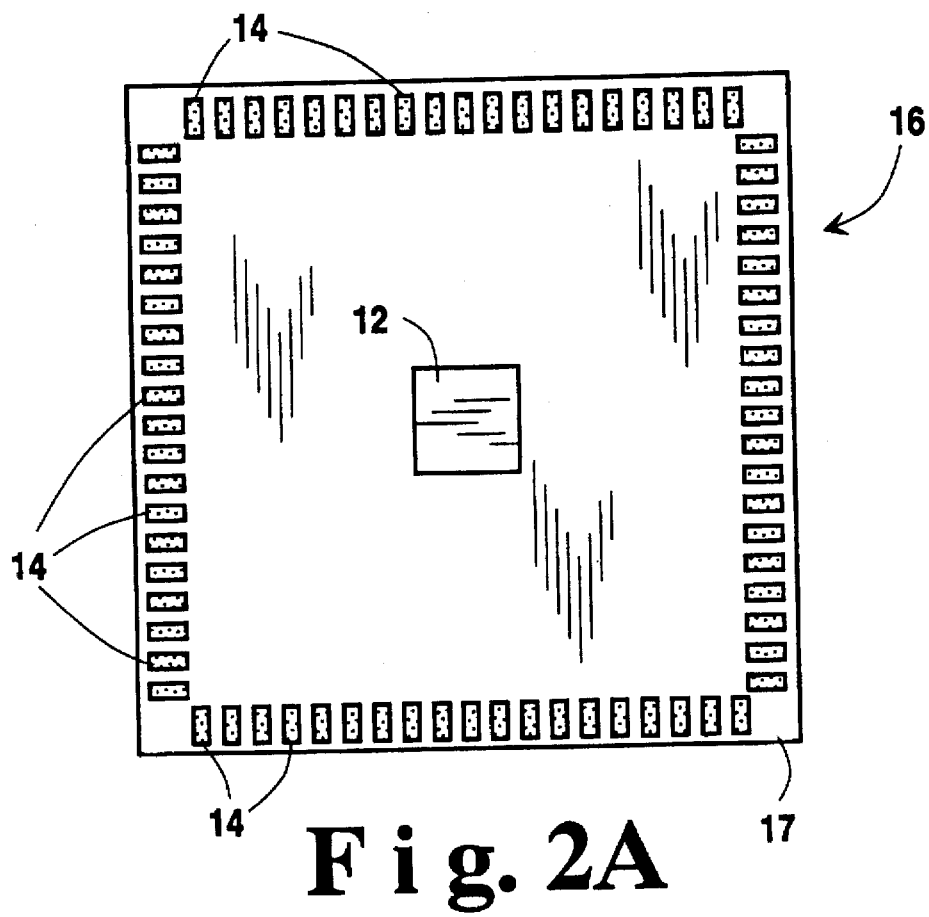
FIGS. 2A and 2B are schematic diagrams of an MLC flat pack of the invention.
Figure 2B:
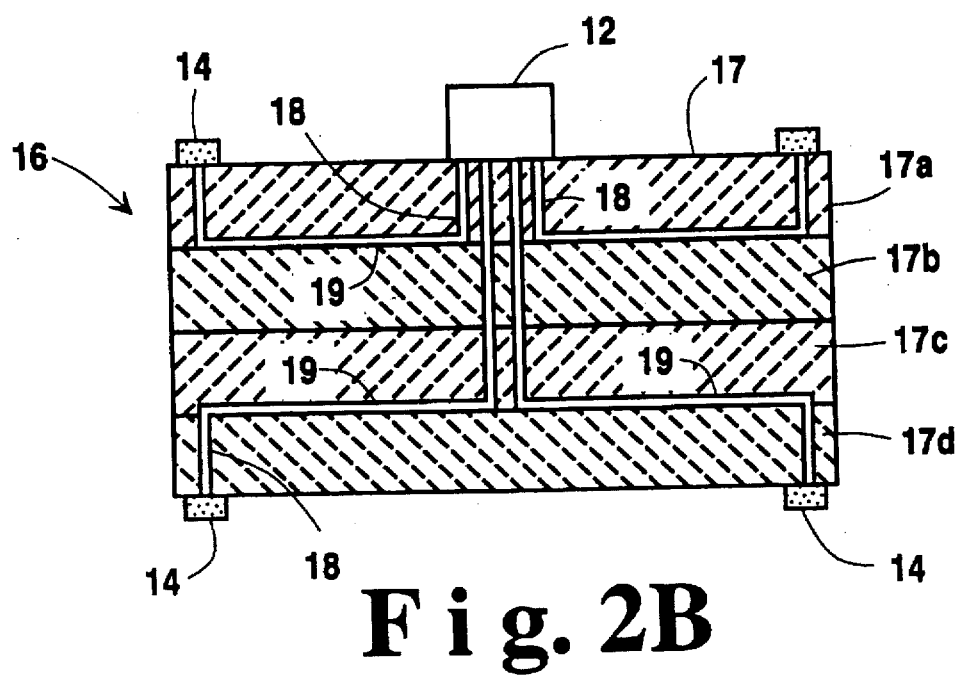

FIG. 2A shows an electronic component 16 of the invention comprising a substrate 17 which is an MLC substrate as shown in side view FIG. 2B. Substrate 17 comprises ceramic layers 17a, 17b, 17c and 17d and is a four layer ceramic construction. Internal vias 18 and lines 19 electrically connect chip 12 to pads 14. It will be appreciated to those skilled in the art that the number of vias 18 and lines 19 and their possible routing within the component 16 is vast and unlike the fan-out technology has no practical mechanical limiting effect on the number of I/O pads which may be provided on the electronic component. It is contemplated that pad spacing may be reduced to 0.25 mm or lower with a concomitant increase in the I/O density of the component. Generally spacings of about 0.3 mm to about 0.5 mm, e.g., and 0.4 mm may be suitably employed.

Figure 3A:
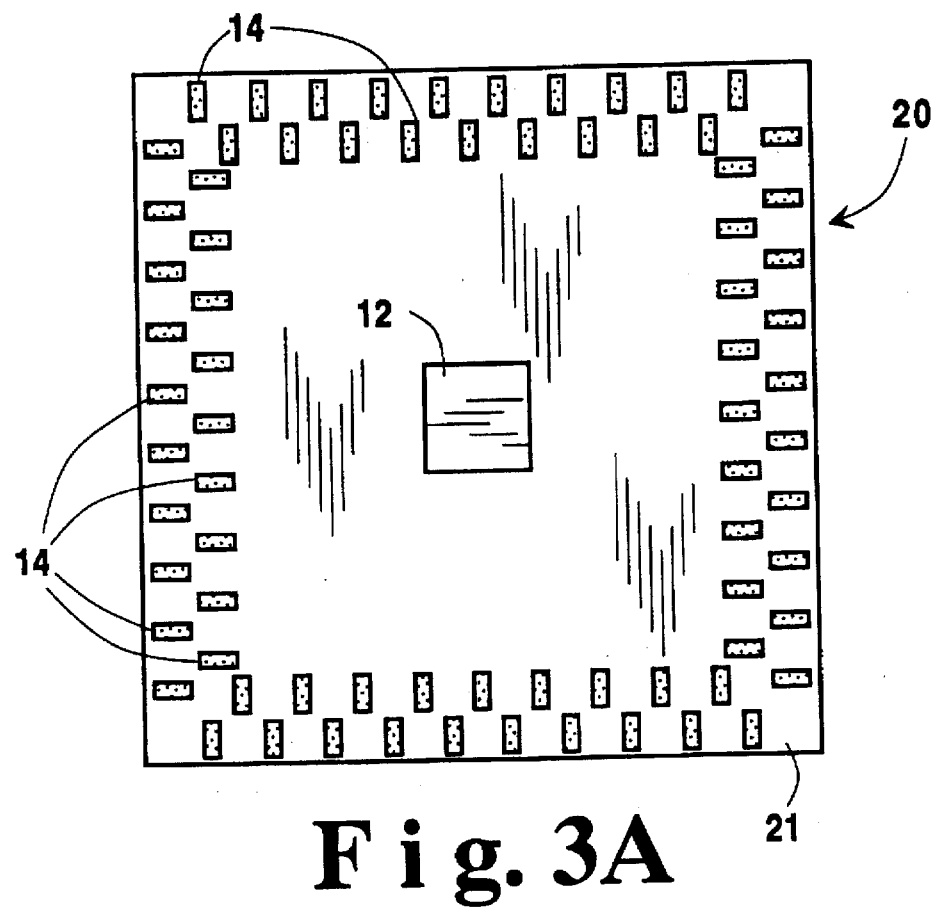
FIGS. 3A and 4B are schematic diagrams of an MLC flat pack of the invention having staggered I/O pads.

FIG. 3A shows another electronic component 20 of the invention having a staggered pad design on one surface thereof. The component 20 comprises a substrate 21 which is an MLC having four layers 21a, 21b, 21c and 21d as shown in side view FIG. 3B. Vias 18 and lines 19 electrically connect chip 12 to pads 14.

Figure 3B:
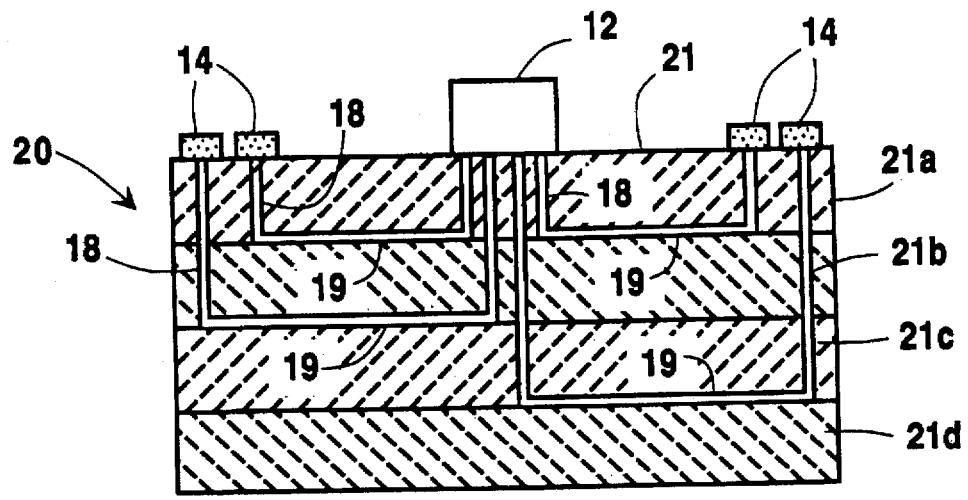

The component 16 depicted in FIGS. 2A and 2B and the component 20 depicted in FIGS. 3A and 3B may be manufactured utilizing multi-layer ceramic technology. For example, individual layers of unfired green ceramic 17a, 17b, 17c and 17d of FIGS. 2A and 2B typically 0.25 mm thick are employed. Each layer is punched to form top to bottom electrical interconnection paths (vias) 18 and subsequently metallized by use of a screening technology through a mask which fills the via holes with a conductive paste. In the case of high temperature co-fired ceramic technology, the paste is limited to refractory metals typically tungsten or molybdenum. The interconnecting planar circuit lines 19 on each layer are screened and metallized in a similar manner.

The number of layers is a function of the packaging density desired and the ability to make the necessary electrical interconnections given a nominal line width of about 4 mils and via diameter of about 6 mils. Typically, a package requiring 304 I/O points will comprise four layers.

The individual layers are laminated under moderate heat and pressure to form a green component. The package is subsequently fired in a sintering operation at 1600° C. for high temperature co-fire technology. The composition of the paste and ceramic are matched so that they sinter at the same temperature thus assuring control of the mechanical properties of the fired component.

Figure 4A:
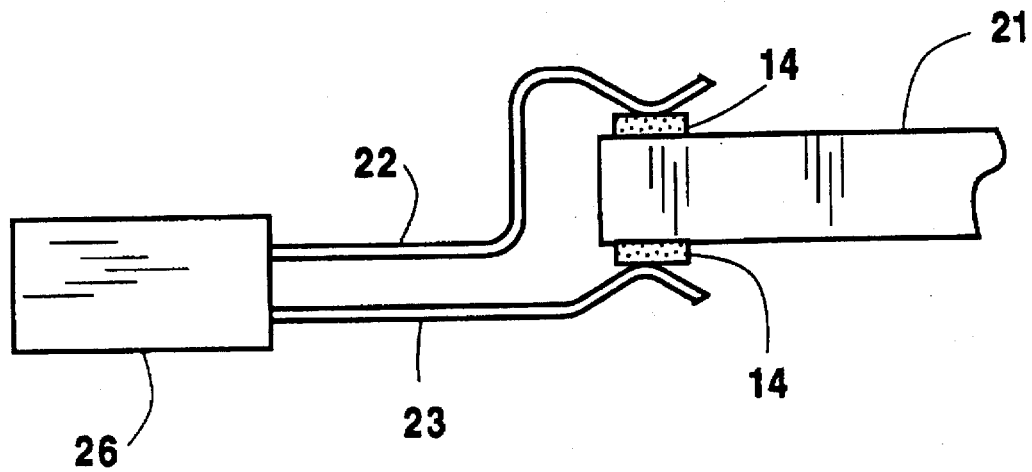
Figure 4B:
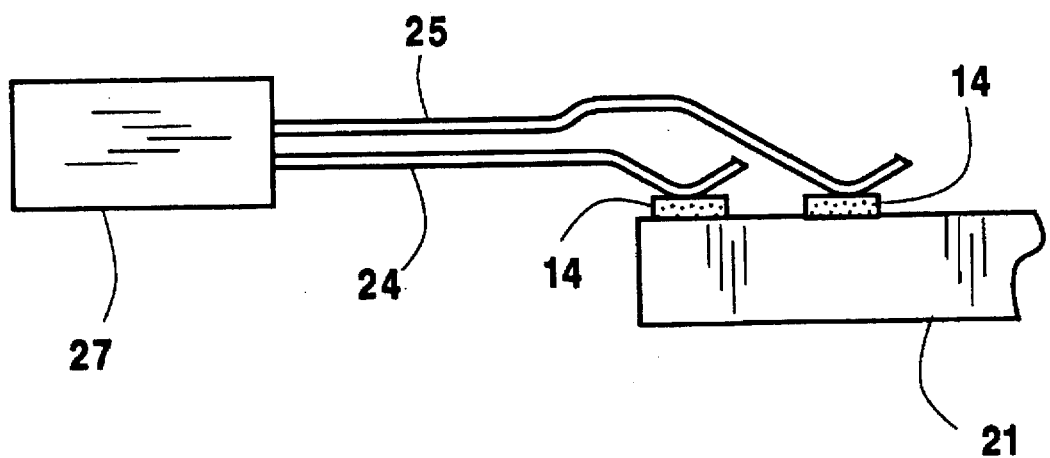

The pads on the fired component are subsequently plated with, for example, nickel and gold to assure corrosion resistance, low electrical contact resistance and provide a metallurgy readily usable for the subsequent assembly and braze of the I/O connectors such as 22, 23, 24 and 25 of FIGS. 4A and 4B as is well-known in the art.

Connectors to electrically connect an outside device to the electronic component of the invention may be made using the spring C-clip of the prior art when there are pads on only one of the opposing surfaces of the MLC as shown in FIGS. 1A and 1B. For components having pads on both surfaces as shown in FIGS. 2A and 2B, clips 22 and 23 and lead frame 26 as shown in FIG. 4A may be employed. Similarly, FIG. 4B shows clips 24 and 25 and lead frame 27 useful with a staggered pad configuration shown in FIGS. 3A and 3B. The length of the clip should be as short as practical to provide increased spring action. Because of the increased densities of the pads, the use of a temporary comb or blade positioning device during the fastening operation may be employed for support and to keep the connectors properly aligned.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

While the invention has been illustrated and described in what are considered to be the most practical and preferred embodiments, it will be recognized that many variations are possible and come within the scope thereof, the appended claims therefore being entitled to a full range of equivalents.

Thus, having described the invention, what is claimed is:

1. A method for making a flat pack electronic component which comprises a multilayer ceramic substrate having electrical conductors in the substrate, a chip secured to the substrate and a plurality of input/output pads on at least one surface of the substrate at the periphery of said substrate with sites on the chip and the pads being electrically connected by the electrical conductors, the method comprising:

forming an individual layer of unfired green ceramic;

forming top to bottom electrical interconnection via paths in the ceramic;

metallizing the vias;

forming planar conductor lines on the ceramic layer;

repeating the above steps for the number of individual ceramic layers desired;

laminating the layers to form the multilayer ceramic substrate in which individual conductor lines on one or more layers are connected with one or more vias in the multilayer ceramic substrate to form individual interconnection circuits within the substrate;

securing a chip to the substrate;

electrically connecting a site on the chip to its corresponding pad on the multilayer ceramic substrate surface by electrically connecting one end of an individual interconnection circuit to the site on the chip and the other end of the individual interconnection circuit to its corresponding pad; and wherein the pads of the flat pack are electrically connected to an outside device by conductor leads from the outside device.

2. The method of claim 1 wherein both surfaces of the multilayer ceramic substrate have input/output pads thereon.

3. The method of claim 1 wherein the pads are staggered.

4. The method of claim 1 wherein electrical conductors on the surface of the substrate to which the chip is attached are employed together with the internal individual interconnections circuits to electrically connect one or more sites on the chip to one or more of the corresponding pads.

5. The method of claim 1 wherein the vias and conductor lines are formed by screening using a conductive paste.

6. The method of claim 1 wherein the pad spacing is about 0.3 mm to 0.5 mm.

7. The method of claim 1 wherein the pad spacing is less than about 0.25 mm.

8. The method of claim 1 wherein the flat pack has more than 304 input/output pads.

9. The method of claim 1 wherein the conductor leads are clips.

10. The method of claim 1 wherein the conductor leads are beam leads.

* * * * *